United States Patent
Ohsugi

(10) Patent No.: US 11,756,708 B2
(45) Date of Patent: Sep. 12, 2023

(54) OXIDE SUPERCONDUCTING WIRE

(71) Applicant: Fujikura Ltd., Tokyo (JP)

(72) Inventor: Masaki Ohsugi, Sakura (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 17/598,525

(22) PCT Filed: Mar. 16, 2020

(86) PCT No.: PCT/JP2020/011480
§ 371 (c)(1),
(2) Date: Sep. 27, 2021

(87) PCT Pub. No.: WO2020/196035
PCT Pub. Date: Oct. 1, 2020

(65) Prior Publication Data
US 2022/0148763 A1    May 12, 2022

(30) Foreign Application Priority Data
Mar. 28, 2019  (JP) .................................. 2019-064778

(51) Int. Cl.
*H01B 12/06* (2006.01)
*C23C 14/02* (2006.01)
(Continued)

(52) U.S. Cl.
CPC ........... *H01B 12/06* (2013.01); *C23C 14/021* (2013.01); *C23C 14/08* (2013.01); *C23C 14/081* (2013.01);
(Continued)

(58) Field of Classification Search
CPC ......... C23C 14/06; C23C 14/08; C23C 14/16; C23C 14/58; C23C 16/06; H01B 12/06;
(Continued)

(56) References Cited

U.S. PATENT DOCUMENTS 6,028,036 A * 2/2000 Tenbrink ............... H01L 39/143
                                                    505/238
6,584,333 B1 * 6/2003 Gauss ................... H10N 60/203
                                                    505/703
(Continued)

FOREIGN PATENT DOCUMENTS

CN    108682509 A    10/2018
JP    H04-022016 A    1/1992
(Continued)

OTHER PUBLICATIONS

E. Wilfred Taylor, "Correlation of the Mohs's scale of hardness with the Vieker's hardness numbers", Mineralogical Magazine and Journal of the Mineralogical Society, vol. 28, Issue 206, Sep. 1949, p. 718-721 (5 pages).
(Continued)

*Primary Examiner* — Brian K Talbot
(74) *Attorney, Agent, or Firm* — Osha Bergman Watanabe & Burton LLP

(57) ABSTRACT

An oxide superconducting wire includes a superconducting laminate including an oxide superconducting layer disposed, either directly or indirectly, on a substrate, and a stabilization layer which is a Cu plating layer covering an outer periphery of the superconducting laminate, and a Vickers hardness of the Cu plating layer is in the range of 80 to 190 HV.

2 Claims, 1 Drawing Sheet

(51) Int. Cl.
  C23C 14/08    (2006.01)
  C23C 14/16    (2006.01)
  C23C 14/22    (2006.01)
  C23C 14/34    (2006.01)
  C23C 14/46    (2006.01)
  C23C 14/58    (2006.01)
  C23C 28/00    (2006.01)
  C25D 3/38     (2006.01)
  H01B 1/08     (2006.01)
  H01F 6/06     (2006.01)

(52) U.S. Cl.
  CPC ......... *C23C 14/082* (2013.01); *C23C 14/083* (2013.01); *C23C 14/165* (2013.01); *C23C 14/221* (2013.01); *C23C 14/3485* (2013.01); *C23C 14/46* (2013.01); *C23C 14/5806* (2013.01); *C23C 28/32* (2013.01); *C23C 28/345* (2013.01); *C25D 3/38* (2013.01); *H01B 1/08* (2013.01); *H01F 6/06* (2013.01)

(58) Field of Classification Search
  CPC .. H01B 13/00; H01F 6/06; B05D 7/20; B05D 2256/00
  USPC ................................ 427/62, 117; 174/125.1
  See application file for complete search history.

(56) References Cited

U.S. PATENT DOCUMENTS

| | | | | |
|---|---|---|---|---|
| 10,262,776 | B2* | 4/2019 | Choi | H01B 12/06 |
| 2004/0121915 | A1* | 6/2004 | Tanaka | H01L 39/2487 |
| | | | | 505/100 |
| 2010/0173784 | A1* | 7/2010 | Lee | H01L 39/143 |
| | | | | 428/411.1 |
| 2013/0085071 | A1* | 4/2013 | Nakanishi | H01B 12/02 |
| | | | | 204/192.24 |
| 2013/0180860 | A1* | 7/2013 | Kamachi | C25D 7/001 |
| | | | | 205/291 |
| 2014/0323314 | A1* | 10/2014 | Takemoto | H01B 13/00 |
| | | | | 505/433 |
| 2014/0357495 | A1* | 12/2014 | Daibo | H01F 6/06 |
| | | | | 505/211 |
| 2015/0024942 | A1* | 1/2015 | Hayase | H01L 39/143 |
| | | | | 428/389 |
| 2015/0357092 | A1* | 12/2015 | Kurihara | H01F 6/06 |
| | | | | 174/125.1 |

FOREIGN PATENT DOCUMENTS

| | | |
|---|---|---|
| JP | H07-021851 A | 1/1995 |
| JP | H07-73759 A | 3/1995 |
| JP | H08-031244 A | 2/1996 |
| JP | H10-069827 A | 3/1998 |
| JP | H10-149729 A | 6/1998 |
| JP | 2001-093364 A | 4/2001 |
| JP | 2001234325 A * | 8/2001 |
| JP | 2006-299363 A | 11/2006 |
| JP | 2007-080780 A | 3/2007 |
| JP | 2010-218730 A | 9/2010 |
| JP | 2014-188655 A | 10/2014 |
| JP | 2015-028912 A | 2/2015 |
| JP | 2016-053190 A | 4/2016 |

OTHER PUBLICATIONS

Mineral hardness, iStone, Apr. 6, 2012, <https://www.istone.org/hardness.html> (4 pages).

Mohs hardness, Kumagai quality store, Jun. 17, 2016, <http://kumagai78.com/oyakudachi11.htm> (4 pages).

Hideki Hagiwara et al., Characteristic Evaluations of Copper Crystal in Deposited Films by Acid Copper Plating for via Filling, Journal of Japan Institute of Electronics Packaging, Mar. 1, 2006, vol. 9, No. 2, pp. 113-118 (13 pages).

International Search Report issued in corresponding International Application No. PCT/JP2020/011480, dated Apr. 14, 2020 (2 pages).

Notification of Reasons for Refusal issued in corresponding Japanese Patent Application No. 2019-064778, dated May 31, 2021 (34 pages).

C Barth et al., "Electro-mechanical properties of REBCO coated conductors from various industrial manufacturers at 77 K, self-field and 4.2K, 19T", Superconductor Science and Technology, IOP Publishing, Feb. 13, 2015, vol. 28, p. 045011-1-10 (14 pages).

Kozo Osamura et al., "Reversible strain limit of critical currents and universality of intrinsic strain effect for REBCO-coated conductors", Superconductor Science and Technology, IOP Publishing, Jan. 23, 2009, vol. 22, p. 025015-1-7 (11 pages).

Kozo Osamura et al., "Internal residual strain and critical current maximum of a surrounded Cu stabilized YBCO coated conductor", Superconductor Science and Technology, IOP Publishing, Apr. 8, 2009, vol. 22, p. 065001-1-6 (9 pages).

Office Action issued in counterpart Japanese Patent Application No. 2021-700163 dated Sep. 16, 2021 (28 pages) with translation.

Office Action issued in counterpart Japanese Patent Application No. 2021-700163 dated Sep. 16, 2021 (12 pages) with translation.

Notice of Reexamination issued in corresponding Chinese Patent Application No. 202080021295.4 dated Apr. 13, 2023 (15 pages).

"Design Manual for Small & Special Electrical Machines", compiled by 21st Research Institute of China Electronics Technology Group Corporation, p. 383, Shanghai Science and Technology Press, Jan. 2017 (4 pages).

"New-Edition Iron and Steel Technology Lecture vol. 2 Steel Production", Tranlation Group of the Reference Room of Shanghai Baoshan General Iron & Steel Works, p. 255, Shanghai Science and Technology Press, May 1981 (4 pages).

* cited by examiner

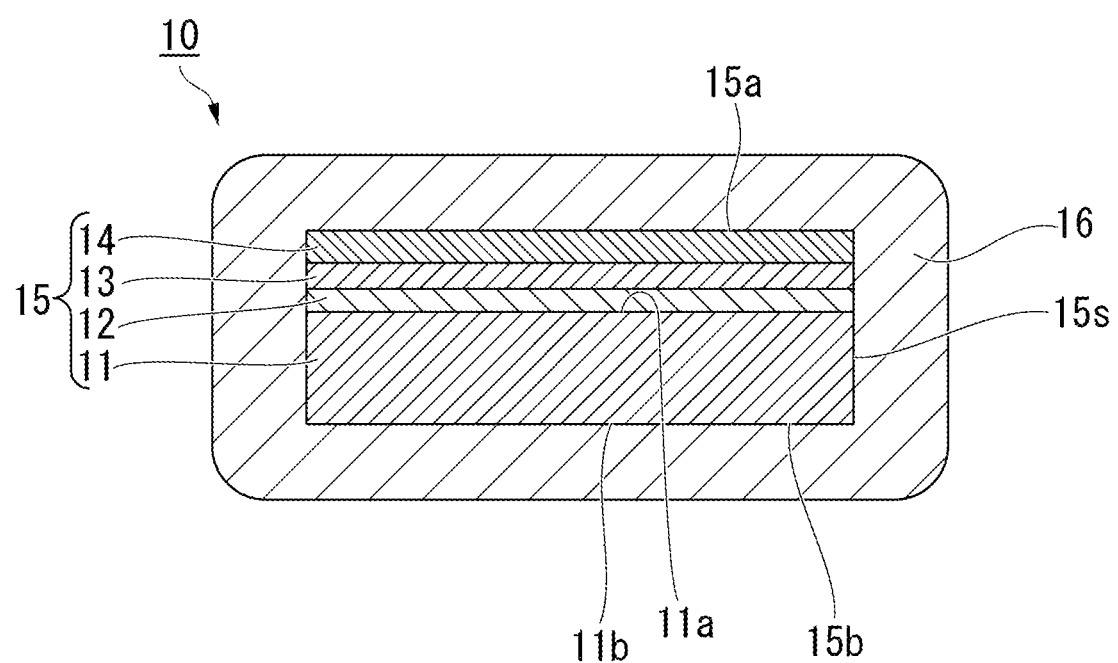

OXIDE SUPERCONDUCTING WIRE

CROSS-REFERENCE TO RELATED APPLICATION

Priority is claimed on Japanese Patent Application No. 2019-064778 filed in Japan on Mar. 28, 2019, the contents of which are incorporated herein by reference in its entirety.

TECHNICAL FIELD

The present invention relates to an oxide superconducting wire.

BACKGROUND

The RE123-based oxide superconductor ($REBa_2Cu_3O_y$, RE is a rare earth element) shows superconductivity at a temperature (approximately 90K) exceeding the liquid nitrogen temperature (77K). Since such superconductors have a higher critical current density in a magnetic field than other high-temperature superconductors, they are expected to be applied to coils, power cables, and the like. For example, Patent Document 1 describes an oxide superconducting wire in which an oxide superconducting layer and an Ag stabilization layer are formed on a substrate, and then a Cu stabilization layer is formed by electroplating.

[Patent Document 1] Japanese Patent Application, First Publication, No. 2007-80780

Oxide superconducting wire requires tensile strength as a mechanical property. A nickel alloy substrate is generally used for the substrate of the oxide superconducting wire, and copper (Cu) is generally used for the stabilization layer; however, the hardness of Cu is lower than that of the substrate. Therefore, the thicker the stabilization layer, the greater the proportion of the stabilization layer in the cross-sectional area of the oxide superconducting wire, and the lower the tensile strength of the oxide superconducting wire as a whole.

One or more embodiments of the present invention provide an oxide superconducting wire having excellent tensile strength.

A first aspect of the present invention is an oxide superconducting wire which includes a superconducting laminate including an oxide superconducting layer on a substrate, and a stabilization layer which is a Cu plating layer covering the outer periphery of the superconducting laminate, and a Vickers hardness of the Cu plating layer is in a range of 80 to 190 HV.

A second aspect of the present invention is an oxide superconducting wire according to the first aspect, in which an average crystal grain size of the Cu plating layer is in a range of 0.52 to 1.00 μm.

A third aspect of the present invention is the oxide superconducting wire according to the first or second aspect, in which an average number of grain boundaries per 100 μm length of the Cu plating layer is 100 or more.

According to one or more embodiments of the present invention, since the Cu plating layer constituting the stabilization layer has a large Vickers hardness, it is possible to provide an oxide superconducting wire having excellent tensile strength.

BRIEF DESCRIPTION OF THE DRAWINGS

FIG. 1 is a cross-sectional view of an oxide superconducting wire according to one or more embodiments.

DETAILED DESCRIPTION

Hereinafter, one or more embodiments of the present invention will be described with reference to the drawings.

As shown in FIG. 1, an oxide superconducting wire 10 according to one or more embodiments includes a superconducting laminate 15 and a stabilization layer 16 that covers the outer periphery of the superconducting laminate 15. The superconducting laminate 15 may include an oxide superconducting layer 13 on a substrate 11. The superconducting laminate 15 may be a structure including, for example, the substrate 11, an intermediate layer 12, an oxide superconducting layer 13, and a protection layer 14.

The substrate 11 is, for example, a tape-shaped metal substrate including a first main surface 11a and a second main surface 11b on both sides in a thickness direction, respectively. Specific examples of the metal constituting the metal substrate include nickel alloys represented by Hastelloy (registered trademark), stainless steel, oriented Ni—W alloys in which a texture is introduced into the nickel alloy, and the like. When an oriented substrate in which the arrangement of metal crystals is aligned and oriented is used as the substrate 11, the oxide superconducting layer 13 can be directly formed on the substrate 11 without forming the intermediate layer 12. A side on which the oxide superconducting layer 13 is formed on the substrate 11 is referred to as a first main surface 11a, and the back surface opposite to the first main surface 11a is referred to as a second main surface 11b. The thickness of the substrate 11 may be adjusted as appropriate in accordance with an object, and is, for example, in the range of 10 to 1000 μm.

The intermediate layer 12 may have a multi-layer structure, and may have a diffusion prevention layer, a bed layer, an orientation layer, a cap layer, and the like in the order from a side of the substrate 11 to a side of the oxide superconducting layer 13, for example. These layers are not always provided one by one, and a portion of the layers may be omitted, or two or more layers of the same type may be repeatedly laminated. The intermediate layer 12 may be a metal oxide. By film-forming the oxide superconducting layer 13 on the intermediate layer 12 having excellent orientation, it becomes easy to obtain the oxide superconducting layer 13 having excellent orientation.

The oxide superconducting layer 13 is composed of, for example, an oxide superconductor. Examples of the oxide superconductor include a RE-Ba—Cu—O-based oxide superconductor represented by the general formula $REBa_2Cu_3O_y$ (RE123) and the like. Examples of the rare earth element RE include one of or two or more of Y, La, Ce, Pr, Nd, Sm, Eu, Gd, Tb, Dy, Ho, Er, Tm, Yb, and Lu. In the general formula of RE123, y is 7-x (oxygen deficiency amount). In addition, the ratio of RE:Ba:Cu is not limited to 1:2:3, and there may be an indefinite ratio. The thickness of the oxide superconducting layer 13 is, for example, approximately 0.5 to 5 μm.

Artificial pins made of different materials may be introduced into the oxide superconducting layer 13 as artificial crystal defects. Examples of different materials used for introducing artificial pins into the oxide superconducting layer 13 can include at least one or more kinds of $BaSnO_3$ (BSO), $BaZrO_3$ (BZO), $BaHfO_3$ (BHO), $BaTiO_3$ (BTO), $SnO_2$, $TiO_2$, $ZrO_2$, $LaMnO_3$, $ZnO$, and the like.

The protection layer 14 has functions such as bypassing overcurrent and suppressing chemical reaction that occurs between the oxide superconducting layer 13 and the layer provided on the protection layer 14. Examples of the material constituting the protection layer 14 can include silver (Ag), copper (Cu), gold (Au), or alloys including one or more kinds of these (for example, Ag alloy, Cu alloy, Au alloy). The thickness of the protection layer 14 may be approximately 1 to 30 μm, and when the protection layer 14 is thinned, the thickness may be 10 μm or less, 5 μm or less, 2 μm or less, or the like. The protection layer 14 may also be formed on a side surface 15s of the superconducting laminate 15 or a second main surface 11b of the substrate 11. The thicknesses of the protection layers 14 formed on the different surfaces of the superconducting laminate 15 may be substantially the same or different. The protection layer 14 may be constituted by two or more kinds of metals or two or more metal layers. The protection layer 14 can be formed by a vapor deposition method, a sputtering method, or the like.

The stabilization layer 16 can be formed over the entire periphery including the first main surface 15a, the second main surface 15b, and the side surface 15s of the superconducting laminated body 15. The first main surface 15a of the superconducting laminate 15 is, for example, the surface of the protection layer 14; however, is not limited thereto. The second main surface 15b of the superconducting laminate 15 is, for example, the second main surface 11b of the substrate 11; however, the present invention is not limited thereto, and for example, the second main surface 15b may be a surface on the protection layer 14 when the protection layer 14 is also formed on the second main surface 11b of the substrate 11. The side surfaces 15s of the superconducting laminate 15 are the respective surfaces on both sides in the thickness direction.

The stabilization layer 16 has functions such as bypassing the overcurrent and mechanically reinforcing the oxide superconducting layer 13 and the protection layer 14. The stabilization layer 16 is a plating layer constituted by a metal such as copper (Cu). The thickness of the stabilization layer 16 is not particularly limited; however, may be approximately 2 to 300 μm, and may be, for example, 200 μm or less, 100 μm or less, 50 μm or less, approximately 20 μm, or the like. The thicknesses of the stabilization layers 16 formed on the first main surface 15a, the second main surface 15b, and the side surfaces 15s of the superconducting laminated body 15 may be substantially equivalent.

In the Cu plating layer constituting the stabilizing layer 16, the Vickers hardness of the Cu plating layer may be in the range of 80 to 190 HV. Since the Vickers hardness of the Cu plating layer is large, the tensile strength of the oxide superconducting wire 10 can be improved. The Vickers hardness can be measured in accordance with, for example, JIS Z 2244 (Vickers hardness test—Test method). The tensile strength of the oxide superconducting wire 10 is affected by the proportion of each layer to the cross-sectional area perpendicular to the longitudinal direction of the oxide superconducting wire 10. Therefore, if the Vickers hardness of the Cu plating layer is large, the tensile strength of the oxide superconducting wire 10 can be improved even when the stabilizing layer 16 is thickened. The relationship between the Vickers hardness of the substrate 11 and the Vickers hardness of the stabilizing layer 16 is not particularly limited; however, the former may be larger than the latter, the former may be smaller than the latter, and the former and the latter may be substantially equivalent.

In the Cu plating layer constituting the stabilization layer 16, the average crystal grain size of the Cu plating layer may be in the range of 0.52 to 1.00 μm. Since the average crystal grain size of the Cu plating layer is relatively small, the metal structure becomes dense and the Vickers hardness can be increased.

In addition, in the Cu plating layer constituting the stabilization layer 16, the average number of grain boundaries per 100 μm length of the Cu plating layer may be 100 or more. Since the average number of grain boundaries per unit length of the Cu plating layer is large, the metal structure becomes dense and the Vickers hardness can be increased. Examples of the unit length include a length of 100 μm in the longitudinal direction of the oxide superconducting wire 10. The upper limit of the average number of grain boundaries per 100 μm length of the Cu plating layer is not particularly limited; however, examples thereof include 100, 120, 150, 180, and 200 grains, or the like.

The average crystal grain size of the Cu plating layer and the average number of grain boundaries per unit length of the Cu plating layer can be measured by, for example, a cross-sectional photograph of the Cu plating layer using a scanning electron microscope (SEM).

The copper plating layer constituting the stabilization layer 16 can be formed by, for example, electroplating. When the copper plating layer is formed by electroplating, a metal layer such as silver (Ag), copper (Cu), tin (Sn) may be formed in advance as a base layer by a vapor deposition method, a sputtering method, or the like. Examples of the plating bath used for electroplating the Cu plating layer can include a copper sulfate plating bath, a copper cyanide plating bath, and a copper pyrophosphate plating bath. As the copper sulfate plating solution, an aqueous solution including copper sulfate pentahydrate, sulfuric acid, additives, chlorine ions and the like is generally used.

At least a portion of the Cu plating layer can be formed by electroless plating. In such a case, a formaldehyde bath, a glyoxylic acid bath, a hypophosphate bath, a cobalt salt bath, and the like are used. A general formaldehyde bath uses a plating solution including a cupric salt, a reducing agent (formaldehyde, and the like), a complexing agent (Rossel salt, and the like), a pH adjuster (sodium hydroxide), and an additive (cyanide).

As a method of adjusting the average crystal grain size of the Cu plating layer or the average number of grain boundaries per unit length of the Cu plating layer, changing the conditions in the electroplating of Cu by at least one or more can be described. Specific conditions for electroplating can include, for example, the concentration of the plating solution, the type of plating bath, the current density, the degree of overvoltage, the temperature, the presence or absence of additives, the presence or absence of heat treatment after electroplating, or the like. For example, the higher the current density, the smaller the average crystal grain size of the Cu plating layer tends to be. In addition, by performing the heat treatment after electroplating, the average crystal grain size of the Cu plating layer becomes large. The additive for the plating bath is not particularly limited; however, examples thereof can include a complexing material, a pH adjuster, a leveler, and the like.

According to the oxide superconducting wire 10 of one or more embodiments of the present embodiment, in the Cu-plated layer constituting the stabilization layer 16, the crystal grain size is small or the average number of grain boundaries per unit length is large, so that the Vickers hardness of the stabilization layer 16 can be increased. As a result, even if the stabilization layer 16 is made thicker, it is possible to suppress a decrease in the tensile strength of the oxide superconducting wire 10 or to improve the tensile strength of the oxide superconducting wire 10.

Although one or more embodiments of the present invention have been described above, the present invention is not limited to the above-described embodiments, and various modifications can be made without departing from the gist of the present invention. Modifications include addition, replacement, omission, and other changes of components in each embodiment.

The film forming method of the intermediate layer 12 and the oxide superconducting layer 13 is not particularly limited as long as an appropriate film forming can be performed according to the composition of the metal oxide. Examples of the film forming method include a sputtering method, a dry film forming method such as a vapor deposition method, and a wet film forming method such as a sol-gel method. The vapor deposition methods include an electron beam deposition (IBAD) method, a pulsed laser deposition (PLD) method, and chemical vapor deposition (CVD) method.

The diffusion prevention layer of the intermediate layer 12 has a function of suppressing a portion of the components of the substrate 11 from diffusing and being mixed as impurities to the oxide superconducting layer 13 side. The diffusion prevention layer is constituted by $Si_3N_4$, $Al_2O_3$, $GZO(Gd_2Zr_2O_7)$, and the like. The thickness of the diffusion prevention layer is, for example, 10 to 400 nm.

The bed layer of the intermediate layer 12 has functions such as reducing the reaction at the interface between the substrate 11 and the oxide superconducting layer 13 and improving the orientation of the layer formed on the substrate 11. Examples of the material of the bed layer include $Y_2O_3$, $Er_2O_3$, $CeO_2$, $Dy_2O_3$, $Eu_2O_3$, $Ho_2O_3$, $La_2O_3$, and the like. The thickness of the bed layer is, for example, 10 to 100 nm.

The orientation layer of the intermediate layer 12 is formed from a biaxially oriented substance to control the crystal orientation of the cap layer formed thereon. Examples of the material of the orientation layer include metal oxides such as $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $Zr_2O_3$, $Ho_2O_3$, $Nd_2O_3$, and the like. The oriented layer may be formed by the IBAD method.

The cap layer of the intermediate layer 12 is formed on the surface of the orientation layer, and the crystal grains are oriented in an in-plane direction. Examples of the material of the cap layer include $CeO_2$, $Y_2O_3$, $Al_2O_3$, $Gd_2O_3$, $ZrO_2$, YSZ, $Ho_2O_3$, $Nd_2O_3$, $LaMnO_3$, and the like. The thickness of the cap layer is, for example, 50 to 5000 nm.

In order to secure electrical insulation with respect to the periphery of the oxide superconducting wire, an insulating tape such as polyimide may be wrapped or a resin layer may be formed around the outer periphery of the oxide superconducting wire. An insulating coating layer such as an insulating tape or a resin layer is not always necessary, and an insulating coating layer may be appropriately provided depending on the use of the oxide superconducting wire, or a configuration without an insulating coating layer may be provided.

To manufacture a superconducting coil using an oxide superconducting wire, for example, the oxide superconducting wire is wound along the outer peripheral surface of the winding frame with the required number of layers to form a coil-shaped multi-layer wound coil, and the oxide superconducting wire can be fixed by impregnating a resin such as an epoxy resin so as to cover the wound oxide superconducting wire.

Examples

Hereinafter, a method of manufacturing the oxide superconducting wire 10 will be described with reference to specific examples. The following examples do not limit the present invention.

First, a superconducting laminate 15 having a predetermined width was prepared by the following procedure.

(1) Polishing of the tape-shaped substrate 11 of Hastelloy (registered trademark) C-276.

(2) Degreasing and cleaning of the substrate 11 with acetone.

(3) Film formation of the $Al_2O_3$ diffusion prevention layer by an ion beam sputtering method.

(4) Film formation of the $Y_2O_3$ bed layer by an ion beam sputtering method.

(5) Film formation of the MgO oriented layer by an IBAD method.

(6) Film formation of the $CeO_2$ cap layer by a PLD method.

(7) Film formation of the $GdBa_2Cu_3O_7$-x oxide superconducting layer 13 by a PLD method.

(8) Film formation of the Ag protection layer 14 by a sputtering method from the surface direction of the oxide superconducting layer 13.

(9) Oxygen anneal treatment of the superconducting laminate 15.

(10) Thinning treatment of the superconducting laminate 15 by slitting with a width of 4 mm.

Next, a Cu base layer was formed on the superconducting laminate 15 by a sputtering method from the direction of the first main surface 15a and the direction of the second main surface 15b.

Next, a stabilization layer 16 having a thickness of 20 μm was formed by copper sulfate plating.

In the examples, the composition of the plating solution was copper sulfate pentahydrate, sulfuric acid, hydrochloric acid, and additives, and the current density was changed for each sample in the range of 1 to 13 $A/dm^2$.

Next, the tensile strength of the obtained oxide superconducting wire 10 was measured. Moreover, the Vickers hardness and the average crystal grain size of the Cu plating layer constituting the stabilization layer 16 were measured.

As the average crystal grain size of the Cu plating layer, 45 cross-sectional SEM photographs (23 μm×23 μm viewing range) were taken for each one sample, three line segments were drawn in the longitudinal direction of the oxide superconducting wire 10 for each one photograph, the number of crystal grains that are completely cut by the line segments according to the cutting method of JIS H 0501 (copper grain size test method) was counted, and the crystal grain size in μm unit obtained as an average value of the cutting length thereof was used as it was for the average crystal grain size of the Cu plating layer. The three line segments drawn in the longitudinal direction of the oxide superconducting wire 10 were located at a depth of approximately 3.2 μm, approximately 10.0 μm, and approximately 16.8 μm from the surface of the stabilization layer 16 having a thickness of 20 μm (i.e., positions of approximately 16%, approximately 50%, and approximately 84%, respectively, with respect to the thickness of the stabilization layer 16).

The average number of grain boundaries (pieces) per 100 μm length of the Cu plating layer was calculated as a numerical value obtained by dividing the 100 μm length by the above-described average crystal grain size (μm).

The measurement results described above are shown in Table 1.

TABLE 1

| No. | VICKERS HARDNESS [HV] | AVERAGE NUMBER OF GRAIN BOUNDARIES PER 100-μm LENGTH [PIECES] | AVERAGE CRYSTAL GRAIN SIZE [μm] | TENSILE STRENGTH [MPa] | EVALUATION RESULT |
| --- | --- | --- | --- | --- | --- |
| 1 | 60 | 30 | 3.30 | 500 | NOT GOOD |
| 2 | 80 | 100 | 1.00 | 600 | GOOD |
| 3 | 100 | 130 | 0.77 | 700 | GOOD |
| 4 | 150 | 150 | 0.67 | 750 | GOOD |
| 5 | 170 | 170 | 0.59 | 780 | GOOD |
| 6 | 190 | 180 | 0.52 | 800 | GOOD |
| 7 | 200 | UNKNOWN | UNKNOWN | UNKNOWN | NOT GOOD |

Generally, the tensile strength required for the oxide superconducting wire is 600 MPa or more. Therefore, as an evaluation result, a sample having a tensile strength of 600 MPa or more was determined to be a non-defective product (Good), and a sample having a tensile strength of less than 600 MPa was determined to be a defective product (Not Good). The result was shown that the larger the Vickers hardness of the Cu-plated layer constituting the stabilization layer, the higher the value of the tensile strength of the oxide superconducting wire.

In the sample No. 7, the current density when forming the Cu plating layer was increased in order to increase the Vickers hardness. However, it became a so-called "plating burn" state, and it became impossible to observe the crystal grains and measure the tensile strength. Therefore, it was determined to be a defective product (NG) due to poor appearance. Therefore, in the sample of No. 7, only the Vickers hardness was measured.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF THE REFERENCE SYMBOLS

10: Oxide superconducting wire, 11: Substrate, 11a: First main surface of the substrate, 11b: Second main surface of the substrate, 12: Intermediate layer, 13: Oxide superconducting layer, 14: Protection layer, 15: Superconducting laminate, 15a: First main surface of superconducting laminate, 15b: Second main surface of superconducting laminate, 15s: Side surface of superconducting laminate, 16: Stabilization layer

The invention claimed is:
1. An oxide superconducting wire comprising:
a superconducting laminate comprising an oxide superconducting layer disposed, either directly or indirectly, on a substrate; and
a stabilization layer which is a Cu plating layer covering an outer periphery of the superconducting laminate,
wherein
a Vickers hardness of the Cu plating layer is in a range of 70 to 195 HV, and
an average number of grain boundaries per 100 μm length of the Cu plating layer is 80 or more.
2. An oxide superconducting wire comprising:
a superconducting laminate comprising an oxide superconducting layer disposed, either directly or indirectly, on a substrate; and
a stabilization layer which is a Cu plating layer covering an outer periphery of the superconducting laminate,
wherein
a Vickers hardness of the Cu plating layer is in a range of 70 to 195 HV,
an average crystal grain size of the Cu plating layer is in a range of 0.52 to 1.25 μm, and
an average number of grain boundaries per 100 μm length of the Cu plating layer is 80 or more.

* * * * *